United States Patent
Zhang

(10) Patent No.: US 10,193,564 B2
(45) Date of Patent: Jan. 29, 2019

(54) ANALOG-TO-DIGITAL CONVERTER

(71) Applicant: TEXAS INSTRUMENTS INCORPORATED, Dallas, TX (US)

(72) Inventor: Zhenyong Zhang, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/339,971

(22) Filed: Nov. 1, 2016

(65) Prior Publication Data

US 2017/0047941 A1    Feb. 16, 2017

Related U.S. Application Data

(63) Continuation of application No. 14/065,129, filed on Oct. 28, 2013, now Pat. No. 9,515,672.

(51) Int. Cl.
| | |
|---|---|
| *G06F 17/00* | (2006.01) |
| *H03M 1/38* | (2006.01) |
| *H03M 1/18* | (2006.01) |
| *H03M 1/12* | (2006.01) |
| *H03M 1/46* | (2006.01) |

(52) U.S. Cl.
CPC ............. *H03M 1/38* (2013.01); *H03M 1/124* (2013.01); *H03M 1/186* (2013.01); *H03M 1/46* (2013.01)

(58) Field of Classification Search
CPC ........ H03M 1/12; H03M 1/1205; H03M 1/18; H03M 1/181; H03M 1/122
See application file for complete search history.

(56) References Cited

U.S. PATENT DOCUMENTS

| | | | |
|---|---|---|---|
| 5,684,480 A | 11/1997 | Jansson | |
| 5,736,949 A | 4/1998 | Ong et al. | |
| 9,515,672 B2 * | 12/2016 | Zhang | ................... H03M 1/186 |
| 2003/0001762 A1 * | 1/2003 | Casper | ................ H03F 3/45183 |
| | | | 341/118 |
| 2005/0231404 A1 * | 10/2005 | Harada | ............... H03M 1/1225 |
| | | | 341/120 |
| 2013/0194119 A1 | 8/2013 | Cheng et al. | |
| 2014/0062751 A1 | 3/2014 | Gopinathan et al. | |
| 2014/0232582 A1 * | 8/2014 | Lian | ..................... H03M 1/1225 |
| | | | 341/158 |

* cited by examiner

*Primary Examiner* — Andrew C Flanders
(74) *Attorney, Agent, or Firm* — Michael A. Davis, Jr.; Charles A. Brill; Frank D. Cimino

(57) ABSTRACT

A system includes an analog-to-digital converter receiving a plurality of input signals. One particular input signal has a particular analog value and the analog-to-digital converter uses a fixed reference to convert the particular analog value to a particular digital value. The analog-to-digital converter uses the particular analog value as a reference for converting the analog values of the remaining input signals.

16 Claims, 4 Drawing Sheets

ANALOG-TO-DIGITAL CONVERTER

CROSS-REFERENCE TO RELATED APPLICATION(S)

This continuation application claims priority under 35 U.S.C. § 120 to U.S. patent application Ser. No. 14/065,129, now U.S. Pat. No. 9,515,672, filed Oct. 28, 2013, which application is hereby incorporated by reference in its entirety.

BACKGROUND

In electronic systems there is a common need to convert analog signals into a form suitable for use by a processor or controller. An analog-to-digital converter (A/D or ADC) is a circuit that converts an analog signal into one or more digital numbers representing the magnitude(s) of the analog signal. In the case of a time-varying input signal, an ADC periodically samples the input signal and generates a series of digital values.

If the input signal has a wide dynamic range (large range of amplitudes) an automatic-gain-control amplifier (AGC) may be used to keep the input to the ADC below the full-scale limit. The gain of the AGC may be controlled by the digital output of the ADC. However, the loop speed for adjusting gain is then dependent on the overall conversion time, and if the input signal also has a high bandwidth the ADC may not be able to track the input signal. An alternative for wide dynamic range input signals is to make a wide range ADC with many bits or digits in each digital output. However, power consumption and complexity of an ADC typically increases with the number of bits in the output. In addition, in many cases, the number of bits per sample needed for accuracy may be much less than the number of bits needed to satisfy the dynamic range.

There is an ongoing need for an ADC with wide dynamic range but with lower complexity and reduced power requirements compared to simply increasing the number of bits.

DETAILED DESCRIPTION

Assuming "n" bits of resolution for the digital output value, and assuming that the analog input signal is a voltage, the output of an ADC is:

$$\text{Digital output} = V_{IN} * \frac{2^n}{V_{REF}} \quad \text{(Equation 1)}$$

where $V_{IN}$ is the sampled analog input voltage, $V_{REF}$ is a reference voltage, and $V_{IN} \leq V_{REF}$.

In a typical ADC, the reference voltage $V_{REF}$ is fixed, and may or may not be an external input. Typically, $V_{REF}$ is the full scale range of the ADC. Typically, a system using the digital outputs of an ADC knows that a full-scale digital output corresponds to some physical quantity (for example, 10V, or 6 Amps, or 16 Kilograms, etc.) and the digital output of the ADC represents a fraction of the known full scale quantity. If $V_{REF}$ is variable, then a system using the digital outputs of an ADC needs to expressly know the value of $V_{REF}$.

Figure 1:
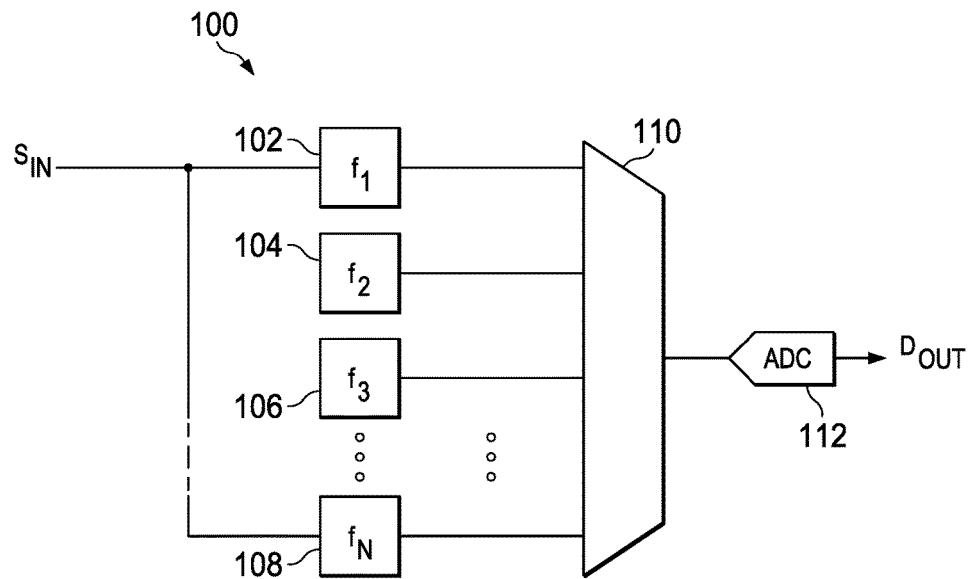
FIG. 1 is a block diagram schematic illustrating an example embodiment of a system with an ADC.

FIG. 1 illustrates an example of a system 100 in which the dynamic range for an ADC may present a challenging design issue. System 100 receives an analog input signal $S_{IN}$. The signal $S_{IN}$ is processed by a plurality of signal processing circuits (102-108). A multiplexer 110 selects the outputs of the signal processing circuits (102-108) one at a time for conversion by an ADC 112. The output of the system 100 is a digital value $D_{OUT}$. In general, the signal amplitude at the outputs of some of the signal processing circuits (102-108) may be much greater than the signal outputs of the other signal processing circuits. If the ADC 112 is designed to accommodate the maximum possible input signal voltage then the digital measurements for the outputs of some signal processing circuits may be very small numbers, resulting in a relatively low signal-to-noise ratio for those measurements.

Figure 2:
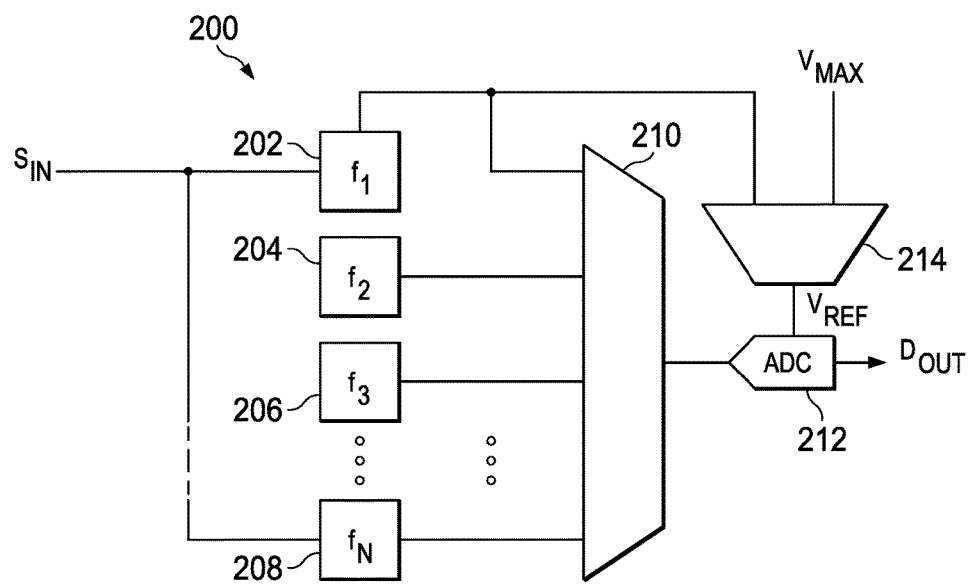
FIG. 2 is a block diagram schematic illustrating an example embodiment of a system as in FIG. 1 but with a variable reference voltage for the ADC.

FIG. 2 illustrates a system 200, which is a specific example embodiment of the system 100 of FIG. 1, with improved dynamic range for the ADC. System 200 receives an analog input signal $S_{IN}$. The signal $S_{IN}$ is processed by a plurality of signal processing circuits (202-208). A multiplexer 210 selects the outputs of the signal processing circuits (202-208) one at a time for conversion by an ADC 212. The output of the system 200 is a digital value $D_{OUT}$. In FIG. 2, during a measurement time interval, the analog magnitude of the output of one particular signal processing circuit (202) is greater than or equal to the analog magnitudes of the outputs of the remaining signal processing circuits (204, 206, 208).

In the example system of FIG. 2, one input to the ADC 212 (from multiplexer 210) is measured with a fixed reference voltage, and the remaining inputs (from multiplexer 210) are measured with a variable reference voltage. The digital value of the variable reference voltage is one output $D_{OUT}$ of the ADC 212. Specifically, when converting the output of signal processing circuit 202, a multiplexer 214 selects a fixed reference voltage ($V_{MAX}$) as the reference voltage $V_{REF}$ for the ADC 212. For the outputs of the remaining signal processing circuits (204, 206, 208), the multiplexer 214 selects the output of signal processing circuit 202 as a variable voltage reference $V_{REF}$ for the ADC 212. The digital output $D_{OUT}$ resulting from converting the output of signal processing circuit 202 is the digital value of the variable reference voltage $V_{REF}$ to be used by a downstream system for interpreting the digital outputs $D_{OUT}$ resulting from converting the outputs of the signal processing circuits 204, 206, and 208.

Assume, for example, that the input signal $S_{IN}$ is an audio signal and the function of system 200 is to measure various characteristics of the audio signal $S_{IN}$ within various frequency bands. For the example of audio signal processing, each signal processing circuit (202-208) may comprise a low-pass or bandpass filter and a non-linear analog circuit that measures the energy of a signal by measuring the square of the magnitude of the signal. Alternatively, each signal processing circuit (202-208) may comprise a low-pass or band-pass filter with a peak detector at the filter output. If the filter in the signal processing circuit 202 has a bandwidth that includes the minimum frequency and maximum frequency of the remaining signal processing circuits (204, 206, 208) then, during a measurement time interval, the magnitude of the output of signal processing circuit 202 will be equal to or greater that the magnitudes of the outputs of the remaining signal processing circuits (204, 206, 208). For example, the filter in the signal processing circuit 202 may be a wide band filter, or the filter may simply be a pass-through device passing signal $S_{IN}$ through with no filtering at all. Therefore, the variable reference voltage $V_{REF}$ for the ADC 212 is equal to or greater than the inputs to the ADC 212 during the measurement time interval.

In the example of FIG. 2, the fixed absolute reference voltage $V_{MAX}$ is equal to or greater than the largest expected input to the ADC 212. During any particular measurement time interval the variable reference voltage $V_{REF}$ may be substantially less than the fixed reference voltage $V_{MAX}$. Accordingly, from equation 1, the digital value $D_{OUT}$ resulting from measurements using a relatively small $V_{REF}$ is greater than the digital value $D_{OUT}$ that would result if the reference voltage was $V_{MAX}$. That is, the digital signal-to-noise ratio is improved by enabling a lower reference voltage $V_{REF}$. However, during any one measurement time interval, there may still be large differences among the outputs of the signal processing circuits (202-208). Some measurements may still be very small digital values, resulting in a relatively low signal-to-noise ratio for those measurements.

One approach to further increase the dynamic range and to improve the signal-to-noise ratio without having to increase the number of bits in the output $D_{OUT}$ is to implement a floating-point ADC. For a floating-point ADC, the output is two digital values: (1) a digital mantissa (dM), and (2) a digital exponent (dE), where the output represents the form $dM*2^{dE}$.

Figure 3A:
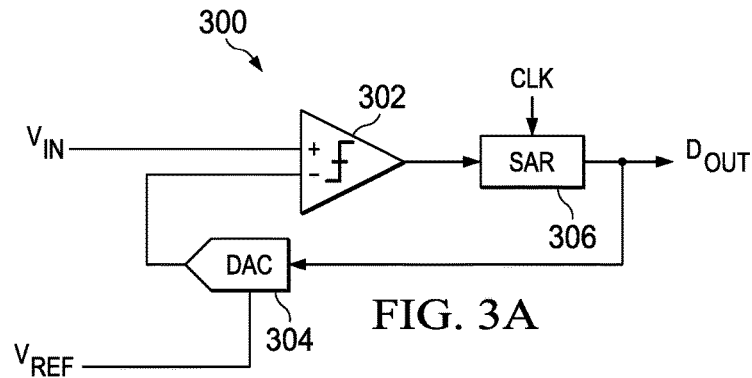
FIG. 3A is a block diagram schematic illustrating an example embodiment of a successive-approximation ADC.
Figure 3B:
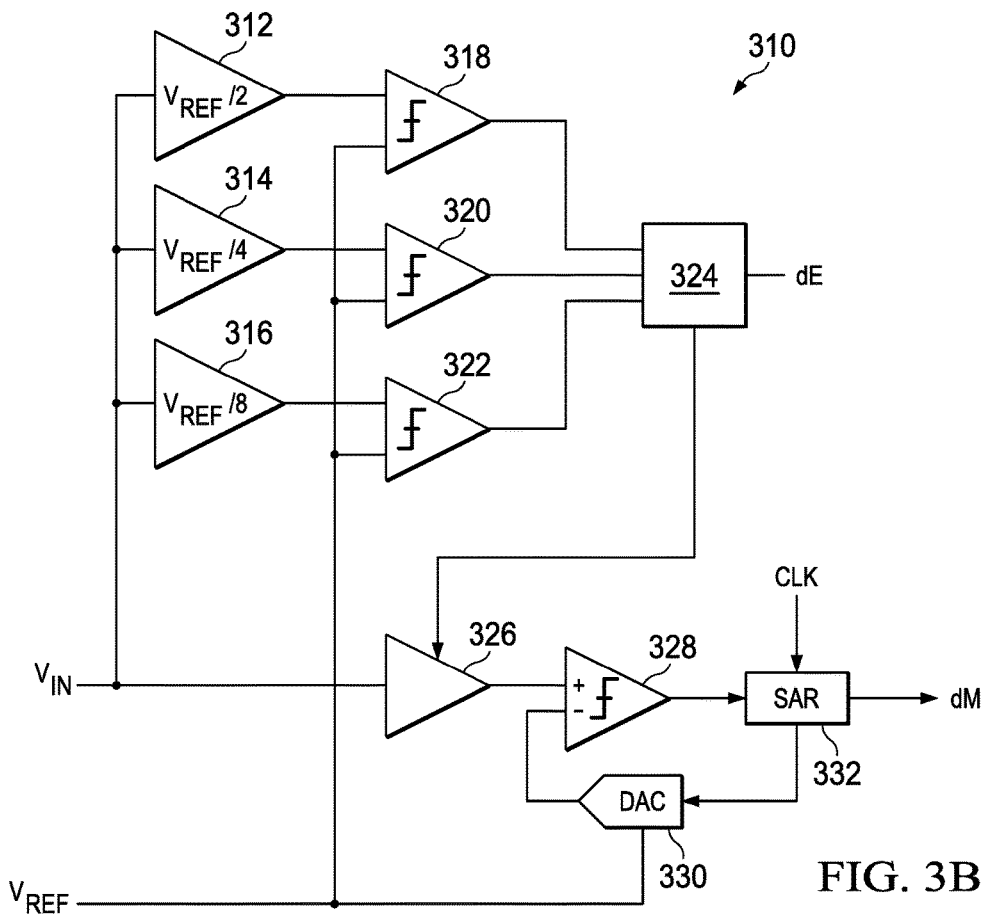
FIG. 3B is a block diagram schematic illustrating an example embodiment of a successive-approximation ADC as in FIG. 3A but implemented as a floating-point ADC.

There are many alternative designs for ADC's and most ADC designs can be implemented as a floating point ADC. FIG. 3A illustrates one example embodiment of an ADC 300. FIG. 3B illustrates an example embodiment of the ADC 300 of FIG. 3A modified to provide a floating point digital output.

FIG. 3A illustrates an example embodiment of a successive-approximation ADC 300. A comparator 302 compares an analog input voltage $V_{IN}$ to the analog output of a digital-to-analog converter (DAC) 304. A successive-approximation-register (SAR) 306 counts clock pulses (CLK). The input to the DAC 304 is the digital output of the SAR 306, When the output of the DAC 304 is equal to the input voltage $V_{IN}$, the comparator 302 causes the SAR 306 to stop counting and the digital value of the SAR 306 is the digital output $D_{OUT}$. The gain of the DAC 304 (analog out digital in) is controlled by a reference voltage $V_{REF}$.

FIG. 3B illustrates an example embodiment of a floating-point successive-approximation ADC. In FIG. 3B, an ADC 310 has a reference voltage input $V_{REF}$. The input signal $V_{IN}$ is amplified by amplifiers (312, 314, 316), each of which has of gain of $V_{REF}$ divided by a power of two. The outputs of the amplifiers (312, 314, 316) are compared to the reference voltage $V_{REF}$ by comparators (318, 320, 322). The outputs of the comparators (318, 320, 322) are received by a logic circuit 324 that generates the digital exponent output dE. In the example of FIG. 3B, the digital exponent output dE is three bits.

The input signal $V_{IN}$ is scaled by an amplifier 326, which has a fractional gain (⅛, ¼, etc.) determined by the digital exponent (logic circuit 324). A comparator 328 compares the scaled analog input voltage to the analog output of a digital-to-analog converter (DAC) 330. A successive-approximation-register (SAR) 332 counts clock pulses (CLK). The input to the DAC 330 is the digital output of the SAR 332. When the output of the DAC 330 is equal to the scaled input voltage, the comparator 328 causes the SAR 332 to stop counting and the digital value of the SAR 332 is the digital mantissa output dM. The gain of the DAC 330 (analog out/digital in) is controlled by the reference voltage $V_{REF}$.

Figure 4:
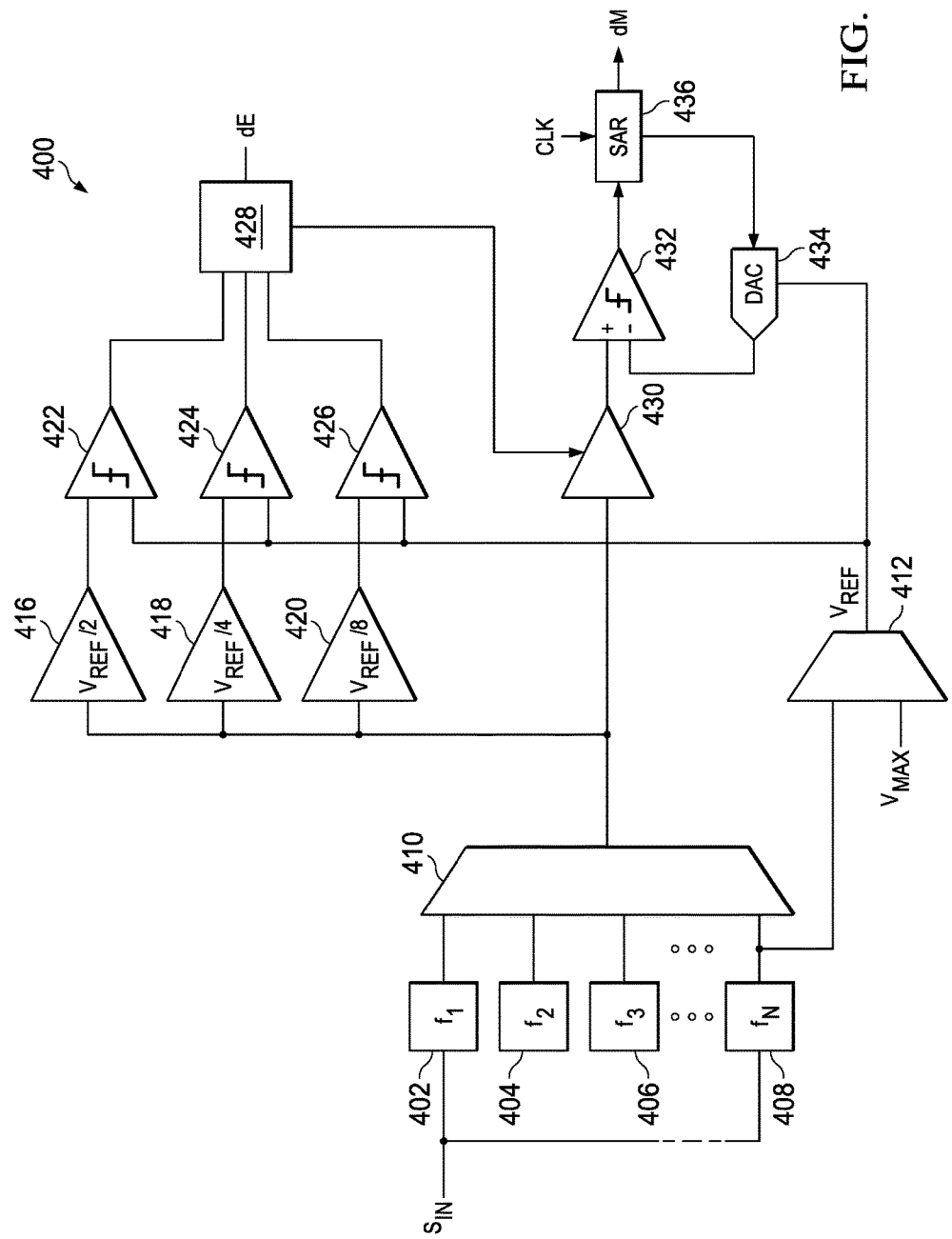
FIG. 4 is a block diagram schematic illustrating an example embodiment of a system as in claim 1 with a successive-approximation floating-point ADC as in FIG. 3B and with a variable reference voltage as in FIG. 2.

FIG. 4 illustrates a system that combines a floating-point ADC with a variable reference voltage to further extend the dynamic range of the floating point ADC. Specifically, FIG. 4 illustrates an example embodiment of a system as in FIG. 1, with a floating-point successive-approximation ADC as in FIG. 33, and with a variable reference voltage based on the maximum signal processing circuit output as in FIG. 2.

In FIG. 4, a system 400 receives an analog input signal $S_{IN}$. The signal $S_{IN}$ is processed by a plurality of signal processing circuits (402-408). A multiplexer 410 selects the outputs of the signal processing circuits (402-408) one at a time for analog-to-digital conversion. A multiplexer 412 selects whether a reference voltage $V_{REF}$ for analog-to-digital conversion is a fixed absolute reference voltage $V_{MAX}$ or the output of one of the signal processing circuits (408). When the system 400 is measuring the output of signal processing circuit 408, the multiplexer 412 selects the fixed absolute reference voltage $V_{MAX}$ as the reference voltage $V_{REF}$ for analog-to-digital conversion. When the system 400 is measuring the outputs of signal processing circuits 404, 406, and 408, the multiplexer 412 selects the output of signal processing circuit 408 as the reference voltage $V_{REF}$ for analog-to-digital conversion. The output of multiplexer 410 is amplified by amplifiers (416, 418, 420), each of which has of gain of $V_{REF}$ divided by a power of two. The outputs of the amplifiers (416, 418, 420) are compared to the reference voltage $V_{REF}$ by comparators (422, 424, 426). The outputs of the comparators (422, 424, 426) are received by a logic circuit 428 that generates the digital exponent output dE. The output of multiplexer 410 is scaled by an amplifier 430, which has a fractional gain (⅛, ¼, etc.) determined by the digital exponent (logic circuit 428). A comparator 432 compares the scaled output of the multiplexer 410 to the analog output of a digital-to-analog converter (DAC) 434. A successive-approximation-register (SAR) 436 counts clock pulses (CLK). The input to the DAC 434 is the digital value of the SAR 436. When the output of the DAC 434 is equal to the scaled output of the multiplexer 410, the comparator 432 causes the SAR 436 to stop counting and the digital value of the SAR 436 is the digital mantissa output dM. The gain of the DAC 434 (analog out/digital in) is controlled by the reference voltage $V_{REF}$.

Effectively, for the system 400 of FIG. 4, for the measurements of the outputs of signal processing circuits 402, 404, and 406, there are four digital outputs: dE and dM resulting from measuring the output of signal processing circuits 402, 404, or 406, and the floating point digital value of $V_{REF}$ (dM and dE resulting from converting the output of circuit 408). The floating-point ADC with variable reference voltage enables a wide dynamic range, with relatively low power dissipation and circuit complexity, and improved signal-to-noise for small signals. For example, in a specific example embodiment, dM is eight bits and dE is two bits. The system achieves an 11-bit dynamic range with 8-bit accuracy and with the power dissipation and complexity of an 8-bit ADC. With the variable reference voltage, the signal-to-noise ratio for small signals is substantially better than a conventional 8-bit ADC.

Figure 5:
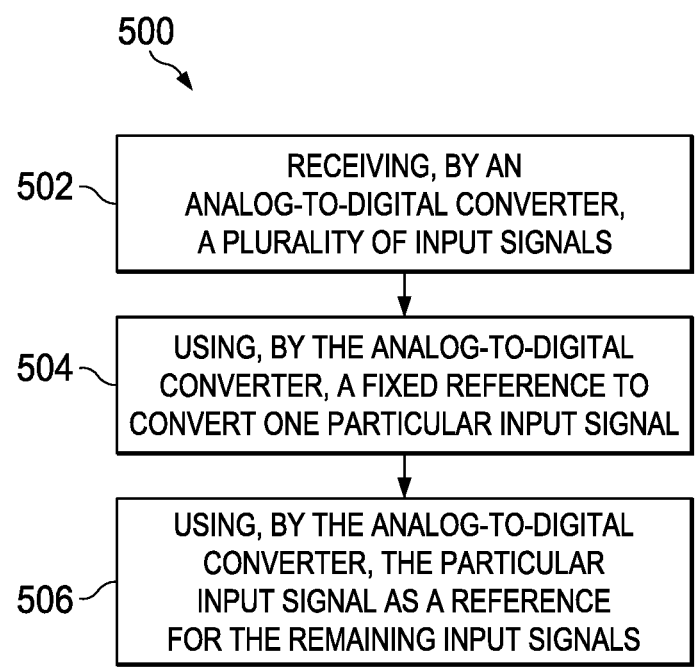
FIG. 5 is a flow chart illustrating an example embodiment of a method.

FIG. 5 illustrates a method 500 for analog-to-digital conversion. At step 502, an analog-to-digital converter receives a plurality of input signals. At step 504, the analog-to-digital converter uses a fixed threshold to convert one particular input signal. At step 506, the analog-to-digital converter uses the particular input signal as the threshold for the remaining input signals.

The description of an audio system with filters is just an example for illustration of a system in which an ADC may receive a wide range of input signal amplitudes. There are many other systems in which an ADC receives multiple inputs having a wide dynamic range. In addition, the use of a floating-point successive-approximation ADC is just one example of a floating-point ADC. There are many alternative ADC designs, most of which may be implemented as a floating-point ADC.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A system, comprising:
a multiplex circuit having: a plurality of inputs to receive a respective plurality of analog signals, including a first input to receive a first analog signal; and an output to provide an output signal, multiplexed from among the received analog signals; and
an analog-to-digital converter (ADC) to convert the output signal, relative to a reference voltage, into a corresponding digital value, wherein: if the output signal is the first analog signal, then the reference voltage is a fixed voltage; and if the output signal is other than the first analog signal, then the reference voltage is a variable voltage of the first analog signal.

2. The system of claim 1, wherein the multiplex circuit is a first multiplex circuit, and the system further comprises a second multiplex circuit to: receive the first analog signal and the fixed voltage; output the fixed voltage to be the reference voltage for the ADC if the output signal is the first analog signal; and output the variable voltage of the first analog signal to be the reference voltage for the ADC if the output signal is other than the first analog signal.

3. The system of claim 1, wherein a magnitude of the first analog signal is greater than or equal to respective magnitudes of the other analog signals during a measurement time interval.

4. The system of claim 1, wherein the analog-to-digital converter is a successive-approximation analog-to-digital converter.

5. The system of claim 1, wherein the analog-to-digital converter is a floating-point analog-to-digital converter.

6. The system of claim 1, wherein the analog-to-digital converter is a floating-point successive-approximation analog-to-digital converter.

7. The system of claim 1, wherein the first analog signal and the other analog signals are derived from a same input signal.

8. A method of operating an analog-to-digital converter (ADC), the method comprising:
receiving a plurality of analog signals via a respective plurality of inputs of a multiplex circuit, including receiving a first analog signal via a first input of the multiplex circuit;
providing an output signal from an output of the multiplex circuit, the output signal being multiplexed from among the received analog signals;
with the ADC, converting the output signal, relative to a reference voltage, into a corresponding digital value, wherein: if the output signal is the first analog signal, then the reference voltage is a fixed voltage; and if the output signal is other than the first analog signal, then the reference voltage is a variable voltage of the first analog signal.

9. The method of claim 8, wherein a magnitude of the first analog signal is greater than or equal to respective magnitudes of the other analog signals during a measurement time interval.

10. The method of claim 8, wherein converting the output signal comprises: converting the output signal into the corresponding digital value by successive approximation.

11. The method of claim 8, wherein the ADC is a floating-point ADC.

12. The method of claim 8, wherein the first analog signal and the other analog signals are derived from a same input signal.

13. The method of claim 8, wherein the multiplex circuit is a first multiplex circuit, and the method further comprises:
with a second multiplex circuit, receiving the first analog signal and the fixed voltage, outputting the fixed voltage to be the reference voltage for the ADC if the output signal is the first analog signal, and outputting the variable voltage of the first analog signal to be the reference voltage for the ADC if the output signal is other than the first analog signal.

14. The system of claim 1, the ADC further including:
a first input coupled to the output of the multiplex circuit to receive the output signal; and
a second input connected to receive the reference voltage.

15. The method of claim 8, further comprising:
with a first input of the ADC, receiving the output signal from the output of the multiplex circuit; and
with a second input of the ADC, receiving the reference voltage.

16. A system, comprising:
a first multiplex circuit including:
a plurality of inputs to receive a respective plurality of analog signals, including a first input to receive a first analog signal; and
a first output to provide a first output signal, multiplexed from among the received analog signals;
a second multiplex circuit including:
a first input to receive the first analog signal;
a second input to receive a fixed voltage; and
a second output to provide a reference voltage, wherein:
if the first output signal is the first analog signal, then the reference voltage is the fixed voltage; and
if the first output signal is other than the first analog signal, then the reference voltage is a variable voltage of the first analog signal; and
an analog-to-digital converter (ADC) including:
a first input to receive the first output signal;
a second input to receive the reference voltage; and an output to convert the first output signal into a corresponding digital value based on the reference voltage.

\* \* \* \* \*